United States Patent
Pidutti et al.

(10) Patent No.: US 10,547,250 B2
(45) Date of Patent: Jan. 28, 2020

(54) RECTIFIER DEVICE

(71) Applicant: Infineon Technologies AG, Neubiberg (DE)

(72) Inventors: Albino Pidutti, Villach (AT); Damiano Gadler, Klagenfurt (AT); Ioannis Pachnis, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/425,641

(22) Filed: May 29, 2019

(65) Prior Publication Data

US 2019/0372477 A1 Dec. 5, 2019

(30) Foreign Application Priority Data

Jun. 1, 2018 (DE) .................. 10 2018 113 146

(51) Int. Cl.
*H02M 7/219* (2006.01)
(52) U.S. Cl.
CPC .................... *H02M 7/219* (2013.01)
(58) Field of Classification Search
CPC .......... H02M 7/02; H02M 7/12; H02M 7/155; H02M 7/1557; H02M 7/21; H02M 7/219;
(Continued)

(56) References Cited

U.S. PATENT DOCUMENTS 5,362,980 A  11/1994 Gough
9,960,705 B1  5/2018 Pidutti et al.
(Continued)

FOREIGN PATENT DOCUMENTS

DE   69316675 T2   7/1998
DE   102013206057 A1   10/2013
DE   102013218959 A1   3/2014

OTHER PUBLICATIONS

Office Action, in the German language, from counterpart German Application No. 102018113146.1, dated Jan. 16, 2019, 8 pp.

*Primary Examiner* — Adolf D Berhane
(74) *Attorney, Agent, or Firm* — Schumaker & Sieffert, P.A.

(57) ABSTRACT

A rectifier device is described herein. In accordance with one embodiment, the rectifier device includes a semiconductor body doped with dopants of a first doping type and one or more well regions arranged in the semiconductor body and doped with dopants of a second doping type. Thereby, the one or more well regions and the surrounding semiconductor body form a pn-junction. The rectifier device further includes an anode terminal and a cathode terminal connected by a load current path of a first MOS transistor and a diode, which is parallel to the load current path. An alternating input voltage is applied between the anode terminal and the cathode terminal during operation of the rectifier device. The rectifier device includes a control circuit that is configured to switch on the first MOS transistor for an on-time period, during which the diode is forward biased, wherein the first MOS transistor and the diode are integrated in the semiconductor body and the control circuit is at least partly arranged in the one or more well regions. Further, the rectifier device includes a switching circuit that is configured to electrically connect a first well region of the one or more well regions with the anode terminal, as long as the alternating input voltage is above a threshold value, and, to pull the voltage of first well region towards the alternating input voltage, as long as the alternating input voltage is at or below the threshold value.

13 Claims, 5 Drawing Sheets

(58) Field of Classification Search
CPC .......... H02M 7/217; H02M 1/14; H02M 1/32; G01R 19/0084
See application file for complete search history.

(56) References Cited

U.S. PATENT DOCUMENTS

| | | | |
|---|---|---|---|
| 10,128,736 B1* | 11/2018 | Gadler | .................... H02M 1/08 |
| 2013/0264654 A1 | 10/2013 | Weis et al. | |
| 2014/0084295 A1 | 3/2014 | Hirler et al. | |
| 2018/0166971 A1* | 6/2018 | Pidutti | .................. H02M 7/219 |
| 2018/0166999 A1* | 6/2018 | Pidutti | ................ H01L 29/7395 |
| 2018/0167000 A1* | 6/2018 | Pidutti | .................... H02M 1/32 |
| 2018/0287506 A1* | 10/2018 | Gadler | .................. H02M 7/217 |

* cited by examiner

RECTIFIER DEVICE

This Application claims priority to German Application Number 102018113146.1, filed on Jun. 1, 2018, the entire content of which is incorporated herein by reference.

TECHNICAL FIELD

This application relates to the field of power supplies, in particular to rectifier circuits and devices and related methods and devices.

BACKGROUND

In an electric power grid electricity is, for various reasons, usually distributed to customers in the form of alternating current (AC). Also alternators are used, for example, in automobiles to generate alternating current. In many applications, alternating current must be converted into direct current (DC) in order to provide a DC supply for electronic circuits or other devices that need a DC supply. This conversion process is referred to as rectification. The standard components used to build a rectifier are silicon diodes. Several types of rectifiers exists. One common type is a single-phase full-wave rectifier that is usually built using four diodes connected in a bridge configuration (a so-called Graetz bridge). As a side note, it should be mentioned that the alternating voltage provided by an electric power grid (e.g. 120 or 230 volts) is usually transformed to lower voltages using transformers before being rectified. In the automotive sector, alternators usually generate multiple-phase output voltages, and, for example, a three-phase full-wave rectifier includes six diodes. Further, rectifier diodes may also be used, for example, in (DC/DC or AC/DC) converters.

Silicon diodes have forward voltages of approximately 0.6 to 0.7 volts. Schottky and germanium diodes have slightly lower forward voltages of approximately 0.3 volts. The forward voltage of a pn-junction (i.e. of a diode) depends on the semiconductor material and can therefore be practically regarded as a constant parameter for a specific semiconductor manufacturing technology, which normally is based on silicon. It is understood, however, that the actual forward voltage is temperature dependent. That is, silicon diodes will always produce a power dissipation of approximately 600 to 700 milliwatts per ampere load current. A diode bridge (bridge rectifier), which is composed of four diodes, thus produces a power dissipation of approximately 1.2 to 1.4 watts per ampere (RMS) of load current as two diodes are always forward biased in a diode bridge. Particularly for comparably low voltages (e.g. 5 to 15 volts), the power dissipation in the rectifier can be a significant portion of the total power consumption.

To reduce power dissipation in rectifier devices, a technique referred to as active rectification may be used. Thereby, silicon diodes are replaced by power transistors such as power MOS field effect transistors (MOSFETs) or power bipolar junction transistors (BJTs), which have a comparably low on-resistance and thus may produce a significantly lower voltage drop as compared to simple silicon diodes. However, usually a relatively complex control circuit is needed to switch the transistor on and off synchronously to the alternating voltage. Different from ordinary high-side semiconductor switches, which are operated at a DC supply voltage, rectifier devices with power MOS transistors are operated at alternating supply voltages. The rectifier may include a control circuit that is configured to switch the power MOS transistor on and off synchronously with the alternating supply voltage. Dependent on the actual implementation another challenge may be the prevention of latch-up effects which may be triggered by the alternating supply voltage, when alternating between positive and negative voltage levels.

SUMMARY

A rectifier device is described herein. In accordance with one embodiment, the rectifier device includes a semiconductor body doped with dopants of a first doping type and one or more well regions arranged in the semiconductor body and doped with dopants of a second doping type. Thereby, the one or more well regions and the surrounding semiconductor body form a pn-junction. The rectifier device further includes an anode terminal and a cathode terminal connected by a load current path of a first MOS transistor and a diode, which is parallel to the load current path. An alternating input voltage is applied between the anode terminal and the cathode terminal during operation of the rectifier device. The rectifier device includes a control circuit that is configured to switch on the first MOS transistor for an on-time period, during which the diode is forward biased, wherein the first MOS transistor and the diode are integrated in the semiconductor body and the control circuit is at least partly arranged in the one or more well regions. Further, the rectifier device includes a switching circuit that is configured to electrically connect a first well region of the one or more well regions with the anode terminal, as long as the alternating input voltage is above a threshold value, and, to pull the voltage of first well region towards the alternating input voltage, as long as the alternating input voltage is at or below the threshold value.

Furthermore, a semiconductor device is described herein that, in accordance with one embodiment, includes a semiconductor body doped with dopants of a first doping type and one or more well regions arranged in the semiconductor body and doped with dopants of a second doping type. During operation, an alternating substrate voltage is applied to the semiconductor body. The semiconductor device further includes a switching circuit that includes a first transistor coupled between the first well region and the anode terminal, a third transistor coupled between the first well region and the cathode terminal, a second transistor coupled between the cathode terminal and a first circuit node, a fifth transistor coupled between the first circuit node and the first well region, and a series circuit with a fourth transistor and a current source circuit coupled between an internal supply node and the anode terminal. The third transistor, the fourth transistor, and the fifth transistor have gate electrodes coupled to a drain of the fourth transistor, and the first transistor has a gate electrode coupled to the first circuit node, and the second transistor has a gate electrode coupled to the internal supply node.

BRIEF DESCRIPTION OF THE DRAWINGS

The embodiment described herein can be better understood with reference to the following description and drawings. The components in the figures are not necessarily to scale, emphasis instead being placed upon illustrating the principles of the embodiments. Furthermore, in the figures, like reference numerals designate corresponding parts. In the drawings:

FIG. 2 illustrates a power MOSFET which can be used to replace a diode in a rectifier circuit, wherein, in the embodiments described herein, the power MOSFET is reverse conducting when switched on.

DETAILED DESCRIPTION

Figure 1:
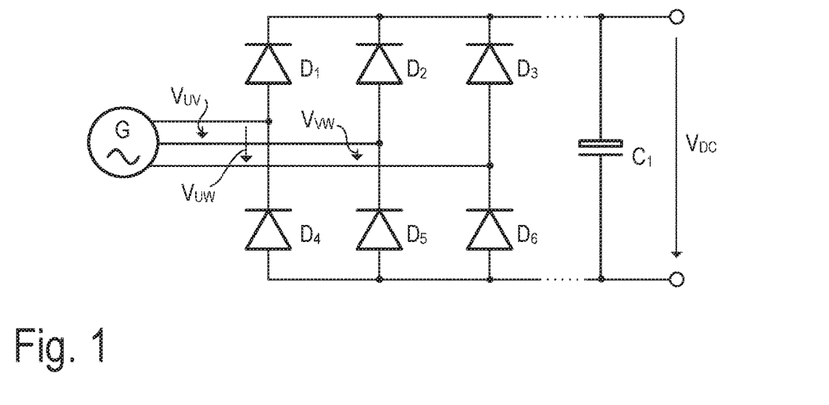
FIG. 1 illustrates, as an illustrative example, a three-phase full-wave rectifier circuit composed of six diodes connected to a three-phase alternator.

As mentioned above, several types of rectifiers exist. FIG. 1 illustrates one exemplary implementation of a three-phase full-wave rectifier, which is built using six diodes $D_1$, $D_2$, $D_3$, $D_4$, $D_5$, $D_6$ connected in a bridge configuration (a so-called three-phase rectifier bridge). FIG. 1 also illustrates a three-phase AC voltage source G which may represent, for example, an electric grid, the secondary sides of a three-phase transformer, an AC generator such as a three-phase alternator used in an automobile, or any other common AC voltage source. The voltage source G provides three-phases, which are connected to the rectifier bridge. The AC voltages between the phases are denoted as $V_{UV}$, $V_{UW}$, and $V_{VW}$. A capacitor $C_1$ may be connected to the output of the rectifier bridge to reduce the ripple of the DC output voltage $V_{DC}$. As mentioned, an automotive battery may be coupled to the rectifier bridge so that the battery can be charged by the generator G.

Silicon diodes usually have a forward voltage of approximately 0.6 to 0.7 volts, and therefore may cause significant power dissipation. To reduce the power dissipation, a silicon diode may be replaced by a rectifier device including a controllable semiconductor switch. In the example illustrated in FIG. 2, the rectifier device 10 includes a power MOS transistor $M_P$ (MOSFET), which has an intrinsic diode $D_R$ (body diode) coupled in parallel to the load current path (drain-source current path) of the power MOS transistor $M_P$. The node and cathode terminals of the rectifier device 10 correspond to anode and cathode of the intrinsic diode and are labelled A and K, respectively. Although a MOSFET is used in the examples described herein, an IGBT with an integrated reverse diode may be used instead. Generally, the rectifier device 10 may have only two terminals and thus may be used as a simple replacement for a normal silicon diode.

Unlike in known active rectifier circuits (also referred to as "synchronous rectifiers"), the power MOS transistor $M_P$ is operated in a reverse conducting mode. Basically, a standard rectifier diode (as used for example in the rectifier bridge of FIG. 1) is replaced by the body diode (see FIG. 2, diode $D_R$) of a power MOS transistor, which can be bypassed by the MOS channel of the power MOS transistor, when the power MOS transistor is activated (i.e. switched on). That is, the power MOS transistor is switched on (which makes the MOS channel conductive), when the body diode is forward biased, thus bypassing the load current path through the body diode. When the diode $D_R$ is reverse biased, the MOSFET $M_P$ is always off during normal operation. In the example depicted in FIG. 2, the rectifier device 10 has only two terminals, a first terminal A (connected to the anode of the body diode $D_R$) and a second terminal K (connected to the cathode of the body diode $D_R$). As will be explained later, the control circuit used to switch the MOSFET $M_P$ on and off may be integrated in the same semiconductor die as the MOSFET $M_P$, and the internal supply of the integrated control circuit may be internally generated from the AC voltage applied at the two terminals A and K. As only two terminals are used by the rectifier device 10, it can readily be used as a replacement for ordinary silicon rectifier diodes to reduce power losses.

Figure 2:
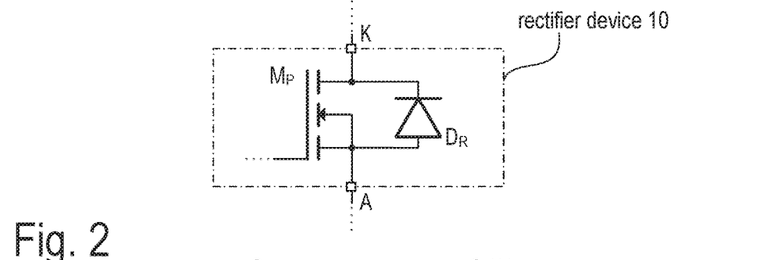
Figure 3:
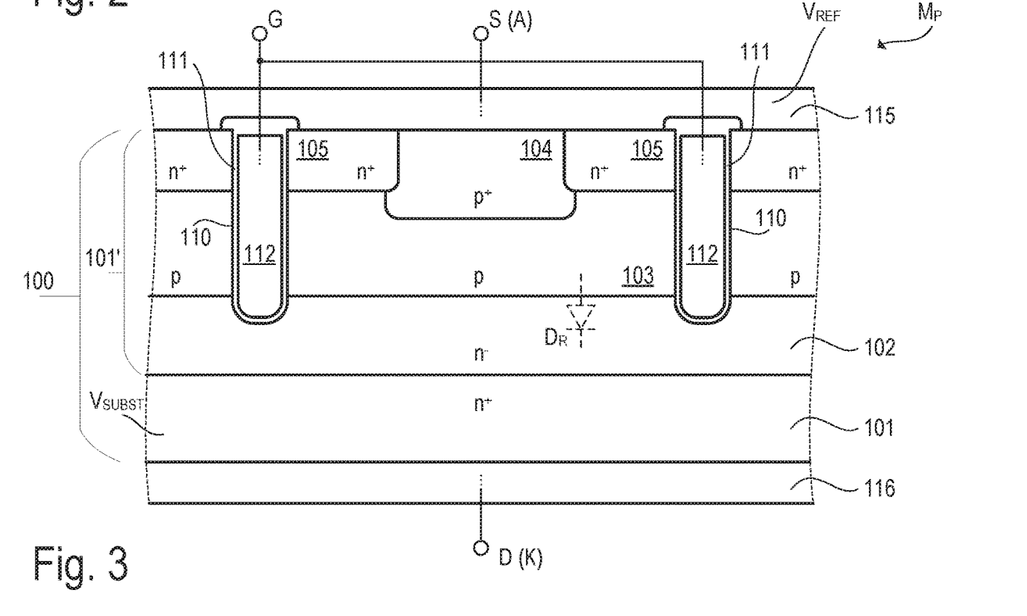
FIG. 3 is a cross-sectional view of a semiconductor body illustrating exemplary implementation of the power MOSFET of FIG. 2.

FIG. 3 illustrates one exemplary implementation of the power MOS transistor $M_P$ of FIG. 2 in a silicon substrate. In the present example, the MOSFET is implemented using a vertical transistor structure composed of a plurality of transistors cells. The term "vertical" is commonly used in the context of power transistors and refers to the direction of the load current path (MOS channel), which extends vertically with respect to a horizontal plane defined by the bottom plane of the semiconductor substrate. The term "vertical" can thus be used to discriminate vertical transistors from planar transistors, in which the load current path (MOS channel) extends parallel to the horizontal plane. In the present example, the vertical MOS transistor is implemented as a so-called trench transistor, which has its gate electrodes arranged in trenches formed in the silicon body. However, other types of vertical power transistors or other types of transistors may be used as well.

Power MOS transistors are usually formed by a plurality of transistors cells coupled in parallel. In the example of FIG. 3, the semiconductor body 100 is essentially formed by a semiconductor substrate 101 (wafer), on which a (e.g. monocrystalline) semiconductor layer 101' is deposited using epitaxial growth. The semiconductor substrate 101 and the semiconductor layer 101' may be doped with dopants of a first doping type, e.g. n-type dopants, wherein the concentration of dopants may be much lower in the semiconductor layer 101' (therefore labelled n⁻) as compared to the highly doped substrate 101 (labelled n⁺). Trenches 110 are formed in the semiconductor layer by an anisotropic etching process. The trenches 110 extend—from the top surface of the semiconductor body 100—vertically into the semiconductor body 100 and are filled with conductive material (e.g. highly doped polycrystalline silicon) to form gate electrodes 112 within the trenches 110. The gate electrodes 112 are isolated from the surrounding semiconductor body 100 by an oxide layer 111, which is disposed on the inner surfaces of the trenches 110 (e.g. by an oxidation process) before filling them with the mentioned conductive material.

An upper portion of the semiconductor layer 101' is doped with dopants of a second doping type, e.g. p-type dopants, e.g. using a first doping process (e.g. diffusion process of dopants or ion implantation). The resulting p-doped region is usually referred to as the body region 103, whereas the remaining n-doped portion of the semiconductor layer 101' (directly adjoining the substrate 101) forms the so-called drift region 102 of the MOS transistor. As the trenches 110 extend down to the drift region 102, the body region 103 is segmented into a plurality of body regions associated with a respective plurality of transistor cells.

A second doping process (e.g. diffusion process of dopants or ion implantation) is used to form source regions 105. Therefore, the MOS transistor $M_P$ is also referred to as DMOS (double-diffused metal-oxide-semiconductor) transistor. The source regions are doped with dopants of the same type as the substrate 101 (e.g. n-type dopants). The concentration of dopants may be comparably high (therefore labelled n$^+$), but is not necessarily equal to the concentration of dopants in the substrate 101. The source regions 105 extend vertically into the semiconductor body starting from the top surface of the semiconductor body and adjoining the trenches 112. Body contact regions 104, which are doped with dopants of the same type as the body regions 103, may be formed between neighboring trenches 110 in order to allow to electrically contact the body regions 103 at the top surface of the semiconductor body 100. The source regions 105 and the body contract regions 104 are electrically contacted at the top surface of the semiconductor body 100 by the conductive layer 115 (e.g. metal layer) that forms the source electrode S of the power MOS transistor. Thereby the individual transistors cells are electrically connected in parallel. The gate electrodes 112 in the trenches 110 must be isolated from the conductive layer 115 and are also connected to each other, e.g. at the end of the trenches 110 (not visible in FIG. 3). The drain electrode D is formed by another conductive layer 116 at the bottom surface of the semiconductor body 100.

The body diode $D_R$ (see also FIG. 3) of the MOSFET is also shown in the cross-sectional view of FIG. 3. It is formed by the p-n junctions at the transitions between the body regions 103 (in each transistor cell) and the drift region 102. The source electrode S (which is electrically connected to the source and body contact regions 105, 104) is therefore also the anode of the diode $D_R$, and the drain electrode D is also the cathode of the diode $D_R$. A transistor designed according to the example of FIG. 3 or similar transistor designs are as such known (sometimes referred to as DMOS transistor) and thus not further explained in detail.

What should be mentioned at this point is that the MOS transistor $M_P$ is not the only component integrated in the substrate. All other circuitry needed to control the switching operation of the MOS transistor $M_P$ can also be integrated in the same semiconductor body 100. The embodiments described herein may be designed as two-terminal rectifier devices (terminals A and K), which have only two external pins and essentially behave like diodes. Unlike a normal silicon diode, the rectifier devices described herein may be designed to have a very low forward voltage as the low-resistive MOS channel bypasses the current path through the body diode $D_R$ while the body diode is forward biased. In the following, the potential at the first terminal A (anode, corresponds to the source electrode of the power MOS transistor $M_P$) is denoted as reference voltage $V_{REF}$, whereas the voltage at the second terminal K (cathode, corresponds to the drain electrode of the power MOS transistor $M_P$) is denoted as substrate voltage $V_{SUBST}$ (voltage present in the substrate 101, see FIG. 3). The reference voltage $V_{REF}$ may be regarded as (floating) ground potential for the circuitry included in the rectifier device 10.

Figure 4:
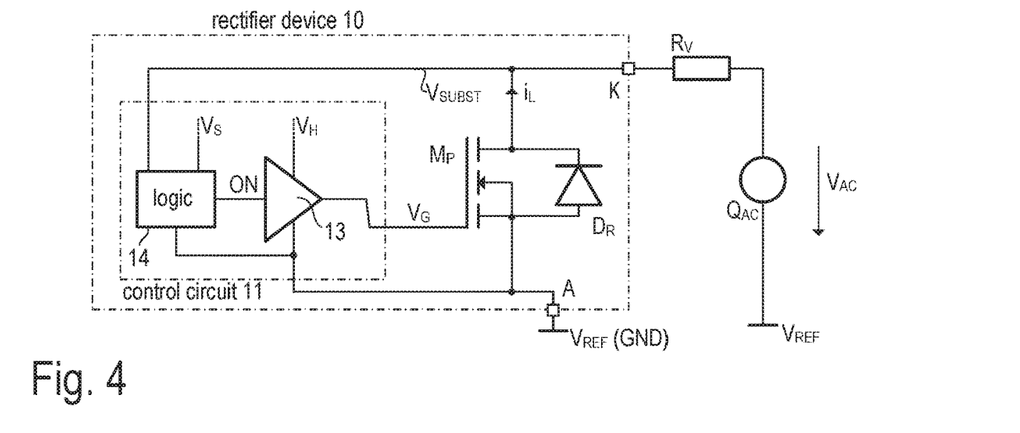
FIG. 4 is a circuit diagram illustrating the power MOSFET of FIG. 2 and a control circuit that is configured to actively switch the MOSFET on when the body diode becomes forward biased.

FIG. 4 illustrates the rectifier device 10 of FIG. 2 in more detail. Accordingly, the rectifier device includes the MOSFET $M_P$ (DMOS transistor), which includes the intrinsic reverse diode $D_R$ (see FIG. 2) as well as a control circuit 11 connected to a gate terminal of the MOS transistor $M_P$. As explained above, the MOS transistor $M_P$ and its intrinsic body diode $D_R$—and also the control circuit 11—are connected between the first and the second terminals A and K. The electric potential $V_{REF}$ at the first terminal (anode) can be defined as zero volts (0 V) and can thus be regarded as reference or ground potential (ground GND) for all circuitry integrated in the semiconductor body 100. With respect to the reference potential $V_{REF}$, the substrate voltage $V_{SUBST}$ may oscillate from negative values of approximately −0.7 volts minimum (i.e. the negative forward voltage of the body diode $D_R$) to a positive peak value $V_{AC\_MAX}$ of an alternating input voltage applied between the two terminals A and K. In the example of FIG. 4, the rectifier device 10 is supplied by an AC source $Q_{AC}$ via a resistor $R_V$. However, supplying the rectifier device 10 as illustrated in FIG. 4 should be regarded merely as a hypothetical example, which is used to explain the function of the rectifier device 10.

In the present example, the control circuit 11 includes a logic circuit 14, which implements the control function for switching the power MOS transistor on and off, as explained further below with reference to FIGS. 7A and 7B, and a gate driver 13 that generates a gate signal $V_G$ based on the logic signal ON provided by the logic circuit 14. The internal supply voltage $V_S$ may be provided by a supply circuit as shown, for example, in FIG. 6. The supply voltage $V_H$ for the gate driver 13 may be buffered, for example, by a capacitor (not shown). The logic circuit 14 is basically configured to detect that the substrate voltage $V_{SUBST}$ has become negative and trigger the activation the MOS transistor $M_P$ by setting the logic signal ON e.g. to a high level. The logic circuit 14 is basically configured to detect that the substrate voltage $V_{SUBST}$ is about to become again positive and trigger the deactivation of the MOS transistor $M_P$. As mentioned, a negative substrate voltage $V_{SUBST}$ entails a forward biasing of the body diode $D_R$.

Figure 5:
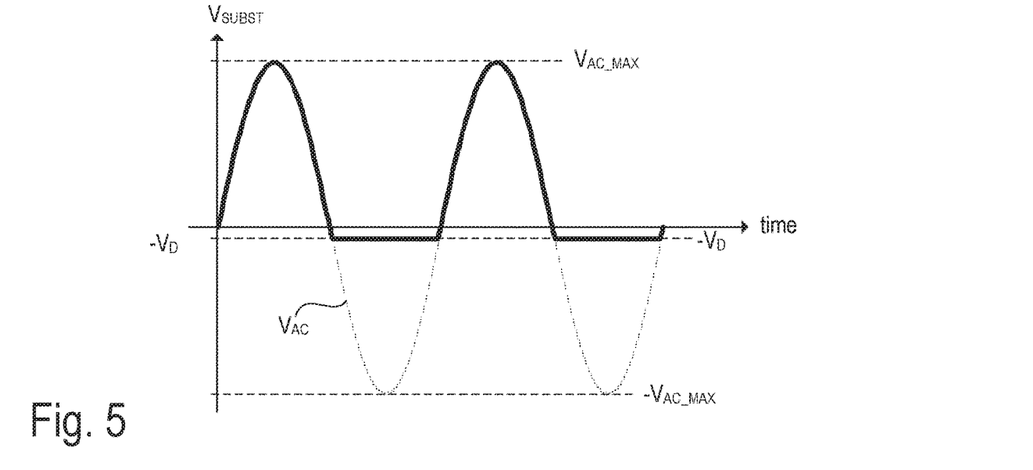
FIG. 5 is a timing diagram illustrating the voltage across the body diode of the MOSFET of FIG. 4, when the MOSFET is connected to a load and not actively switched on while being supplied with an alternating voltage.

FIG. 5 is a timing diagram illustrating the waveform of the substrate voltage $V_{SUBST}$ with respect to the reference potential $V_{REF}$ for the hypothetic case, in which the MOSFET $M_P$ included in the rectifier device 10 is never switched on and, therefore, the load current $i_L$ can only pass the rectifier device 10 via the body diode $D_R$. In this example it is further assumed that an alternating input voltage $V_{AC}$ is applied to a series circuit of the rectifier device 10 and a load (see FIG. 4, resistor $R_V$). Without loss of generality, the reference potential $V_{REF}$ may be defined as 0 V. While the body diode $D_R$ is reverse biased ($V_{SUBST}$>0 V), the substrate voltage $V_{SUBST}$ follows the alternating input voltage $V_{AC}$ and the load current is approximately zero (diode $D_R$ is blocking). While the body diode $D_R$ is reverse biased ($V_{SUBST}$<0V) during normal operation, the substrate voltage $V_{SUBST}$ follows the alternating input voltage $V_{AC}$ as long as the alternating input voltage $V_{AC}$ is higher than the negative forward voltage −$V_D$ of the body diode $D_R$ (e.g. $V_{AC}$>−0.6V). However, when the instantaneous level of the alternating input voltage $V_{AC}$ becomes lower (i.e. more negative) than the negative forward voltage −$V_D$ of the body diode $D_R$ (e.g., $V_{AC}$<−0.6V), the substrate voltage $V_{SUBST}$ will be approximately limited to the negative forward voltage −$V_D$ of the body diode $D_R$ (e.g., $V_{SUBST}$≈−0.6V). In this situation, the diode $D_R$ is forward biased and thus conductive, and the difference between the (negative) substrate voltage and the alternating input voltage $V_{AC}$ is the voltage drop across the load (e.g., resistor $R_V$ in the example of FIG. 4). The load current $i_L$ actually passing through the rectifier device 10, while ($V_{AC}$<−$V_D$) depends on the load.

As mentioned above, a voltage drop across the rectifier device 10 of approximately 600 to 700 mV (at room temperature) may cause significant power dissipation. To reduce the substrate voltage $V_{SUBST}$ while the body diode $D_R$ is forward biased, the MOS transistor $M_P$ can be switched on to make the MOS channel of the MOS transistor $M_P$ conductive. In this case, the body diode $D_R$ is bypassed via the low-ohmic current path provided by the MOS channel. However, in the time period in which the body diode $D_R$ is reverse biased (i.e. blocking), the MOS transistor should remain switched off. The logic circuit 14 that controls the switching operation of the MOS transistor $M_P$ is included in the control circuit 11 (see FIG. 4). Accordingly, the rectifier device 10 essentially behaves like a diode with a very low forward voltage of approximately 100-200 millivolts.

As shown in FIG. 4, the control circuit 11 is coupled between the two terminals A and K, at which the alternating input voltage is applied (see FIG. 5). However, some circuit components in the control circuit 11 need a DC supply voltage in order to operate properly. Therefore, the control circuit 11 may include at least one supply circuit, which provides an internal supply voltage $V_S$ for supplying various other circuit components of the control circuit 11. Before explaining exemplary implementations of the control circuit 11 and its function in more detail, an exemplary implementation of the internal supply circuit is explained with reference to FIG. 6.

Figure 6:
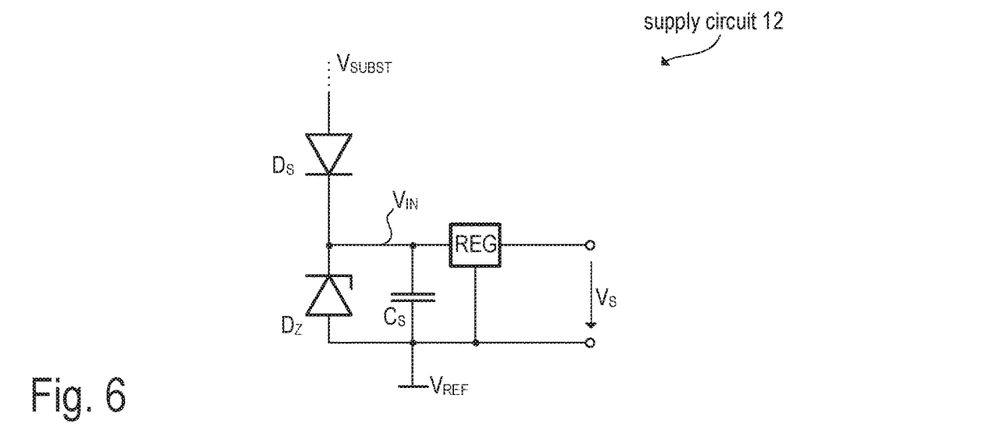
FIG. 6 is a circuit diagram illustrating an exemplary supply circuit which may be included in the control circuit to generate an internal supply voltage.

The exemplary supply circuit 12 illustrated in FIG. 6 is coupled between the first terminal A (reference potential $V_{REF}$) and the second terminal K (substrate voltage $V_{SUBST}$), which are connected to the source and drain of the power MOS transistor $M_P$, respectively. In this example, a series circuit composed of a diode $D_S$ and a Zener diode $D_Z$ is electrically connected between the substrate (being at substrate voltage $V_{SUBST}$) and the source electrode of the MOS transistor $M_P$ (being at reference potential $V_{REF}$). A buffer capacitor $C_S$ is connected parallel to the Zener diode $D_Z$ as shown in FIG. 6. The capacitor $C_S$ is charged via the diode $D_S$ when the level of the substrate voltage $V_{SUBST}$ is higher than the sum of the voltage $V_{IN}$ across the capacitor $C_S$ and the forward voltage of the diode $D_S$. The Zener diode $D_Z$ limits the capacitor voltage $V_{IN}$ across the capacitor $C_S$ to a maximum value, which is determined by the Zener voltage of the Zener diode $D_Z$. Further, the diode $D_S$ prevents the discharging of the capacitor $C_S$ via the substrate when the substrate voltage $V_{SUBST}$ falls to values lower than the capacitor voltage $V_{IN}$. The capacitor voltage $V_{IN}$ may be supplied as input voltage to a voltage regulator device REG, and the input voltage $V_{IN}$ is buffered by the capacitor $C_S$ while the substrate voltage $V_{SUBST}$ is low. The regulated output voltage of the voltage regulator REG is denoted as $V_S$. The regulated output voltage $V_S$ may be regarded as internal supply voltage that is used to supply any circuitry (e.g. logic circuits such as logic circuit 14, see FIG. 4) integrated in the rectifier device 10.

It is noted that the circuit of FIG. 6 should be regarded as an illustrative example and may also be implemented in various alternative ways. For example, the Zener diode $D_Z$ may be replaced by a any voltage limiting circuit configured to limit the capacitor voltage to a desired maximum. Further, diode $D_S$ may be replaced by a transistor that is able to limit the current passing through it. Dependent on the application, the Zener diode $D_Z$ may be omitted. The capacitor $C_S$ may be replaced by any circuit (e.g. series or parallel circuit of several capacitors) that provides a sufficient capacitance to be able to buffer the input voltage $V_{IN}$ while the substrate voltage $V_{SUBST}$ is too low to charge the capacitor $C_S$. In some implementations, the voltage regulator REG may be substituted by other circuitry that provides a similar function. If the capacitance of the capacitor $C_S$ is high enough to ensure an acceptably low ripple, the regulator REG may be also omitted.

Figure 7A:
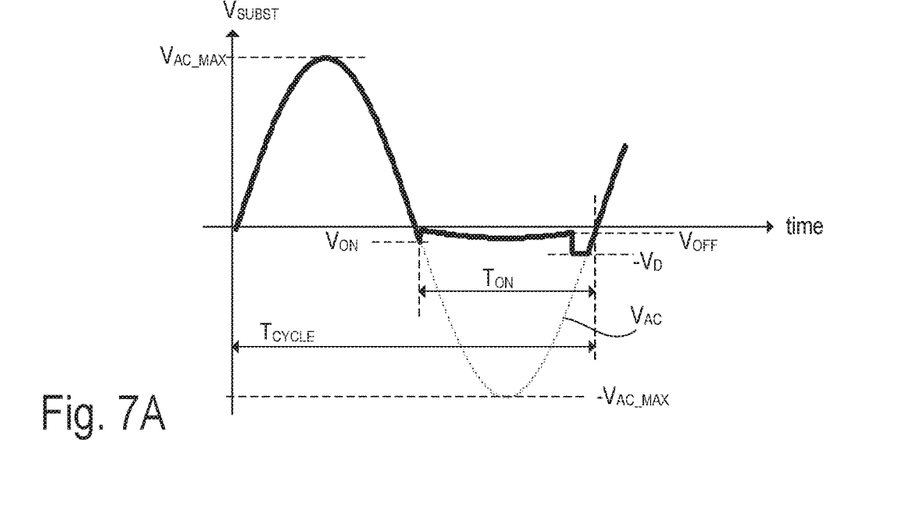
FIGS. 7A and 7B are a timing diagrams illustrating one example of how the MOSFET of FIG. 4 may be switched on and off when supplied with an alternating voltage.
Figure 7B:
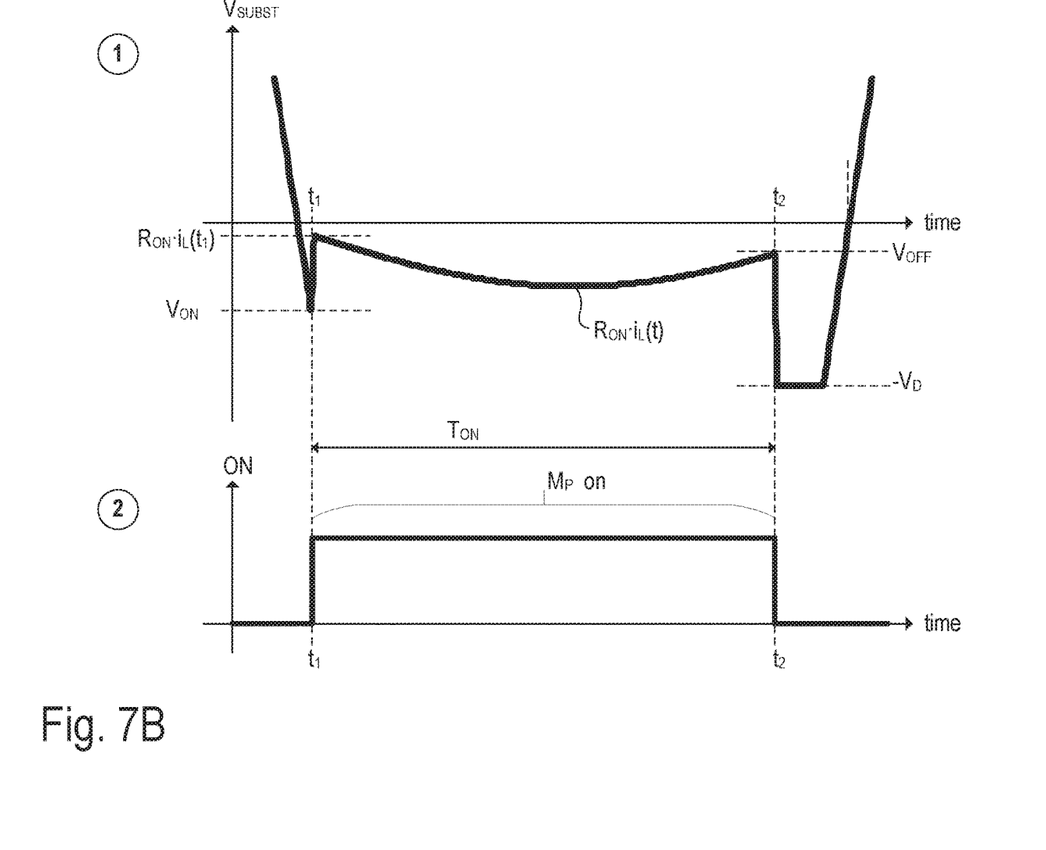

FIGS. 7A and 7B include timing diagrams illustrating the function of one exemplary embodiment of the rectifier device 10 implemented according to the basic example of FIG. 4. In particular, the function of the control logic used to switch on and switch off of the MOS transistor $M_P$ is illustrated by the timing diagrams of FIGS. 7A and 7B. The diagram of FIG. 7A is essentially the same as the diagram of FIG. 5 except that, in the current example, power MOS transistor $M_P$ is switched on when the intrinsic body diode $D_R$ is forward biased in order to bypass the body diode $D_R$ via the activated MOS channel. The bypassing of the body diode $D_R$ results in a voltage drop across the rectifier device 10 which is significantly lower than the forward voltage of a normal diode.

The first diagram of FIG. 7B shows a magnified segment of the waveform shown in FIG. 7A. FIG. 7A shows a full cycle of the substrate voltage $V_{SUBST}$, whereas the first diagram of FIG. 7B only shows approximately the second half of the cycle, during which the substrate voltage $V_{SUBST}$ is negative. The second diagram of FIG. 7B illustrates a simplified waveform of the logic signal ON (see FIG. 4) which triggers the activation/deactivation of the MOS transistor $M_P$ to switch it on and off. As can be seen in FIGS. 7A and 7B, the MOS transistor $M_P$ is switched on when the control circuit 11 detects (by means of logic circuit 14, see FIG. 4) that the substrate voltage $V_{SUBST}$ is negative (i.e. the diode $D_R$ is forward biased). This detection can be made based on various criteria. In the present example, negative threshold voltages $V_{ON}$ and $V_{OFF}$ are used to determine the time instants for switching the MOS transistor $M_P$ on and off (i.e. begin and end of the on-time period $T_{ON}$ of MOS transistor $M_P$). Accordingly, the MOS transistor $M_P$ is switched on when the substrates voltage $V_{SUBST}$ reaches or falls below the first threshold $V_{ON}$, and the MOS transistor $M_P$ is switched off when the substrates voltage $V_{SUBST}$ again reaches or exceeds the second threshold $V_{OFF}$.

In the present example, the condition $V_{SUBST}=V_{ON}$ is fulfilled at time $t_1$ and the control signal ON (see second diagram of FIG. 7B), as well as the corresponding gate voltage $V_G$, are set to a high level to switch the MOS transistor $M_P$ on. When the substrate voltage $V_{SUBST}$ reaches or exceeds the second threshold $V_{OFF}$ at the end of a cycle, the MOS transistor $M_P$ is switched off again. In the present example, the condition $V_{SUBST}=V_{OFF}$ is fulfilled at time $t_2$ and the control signal ON (see bottom diagram of FIG. 7B), as well as the corresponding gate voltage $V_G$, are set to a low level to switch the MOS transistor $M_P$ off. When the MOS transistor $M_P$ is switched off at time $t_2$, the substrate voltage $V_{SUBST}$ may abruptly fall to −$V_D$ before it again rises to positive values at the beginning of the next cycle. It is understood that the waveforms shown in FIGS. 7A and 7B are merely an illustrative example and are not to scale.

While the MOS transistor $M_P$ is switched on (i.e. during the on-time period $T_{ON}$), the substrate voltage $V_{SUBST}$ equals $R_{ON} \cdot i_L$, wherein $R_{ON}$ is the on-resistance of the activated MOS channel. In the present example, only two threshold values are used to switch the MOS transistor $M_P$ on and off. However, two or more threshold values may be used to switch-on and/or switchoff. In this case the power MOSFET may be switched on or off (or both) gradually (stepwise) by subsequently switching on/off two or more groups of transistor cells of the power MOSFET.

Referring back to FIG. 7A, both the first threshold $V_{ON}$ and the second threshold $V_{OFF}$ are negative (note that the reference voltage $V_{REF}$ is defined as zero), but higher than the negative forward voltage $-V_D$ of the body diode $D_R$ of the MOS transistor $M_P$. Further, the second threshold $V_{OFF}$ may be higher (less negative) than the first threshold $V_{ON}$. That is, the condition $-V_D<V_{ON}<V_{OFF}<0$ V is fulfilled in the present example, e.g. $V_{ON}=-250$ mV and $V_{OFF}=-50$ mV, while $-V_D \approx -700$ mV. At this point it should be noted that the cycle time $T_{CYCLE}$ is given by the frequency of the AC input voltage $V_{AC}$.

As can be seen in FIG. 7B, the MOS transistor $M_P$ should only switch on once in each cycle (see FIG. 7A, period $T_{CYCLE}$) of the substrate voltage $V_{SUBST}$, specifically, when the condition $V_{SUBST}=V_{ON}$ is met for the first time. When the condition is met again in the same cycle, a second switch-on of the MOS transistor $M_P$ should be prevented (e.g. at time instant $t_2$, see first diagram of FIG. 7A). Similarly, the MOS transistor $M_P$ should be switched off when the condition $V_{SUBST}=V_{OFF}$ is met at the end of a cycle. If this condition is met earlier during a cycle (e.g. shortly after time $t_1$, if $R_{ON} \cdot i_L(t_1)>V_{OFF}$), an early switch-off of the MOS transistor should be prevented. In order to avoid an undesired early switch-off of the MOS transistor, the control circuit may include a timer that prevents a switch-off for a specific time span (e.g. during the first half of the on-time $T_{ON}$). It is noted that the control logic (e.g. control logic 14, see FIG. 4) that exhibits the behaviors illustrated in FIGS. 7A and 7B may be implemented in numerous different ways. The actual implementation may depend on the application as well as on the semiconductor technology used to manufacture the rectifier device 10. It is understood that a skilled person is able to implement the functionality discussed above with reference to FIGS. 7A and 7B.

Figure 8:
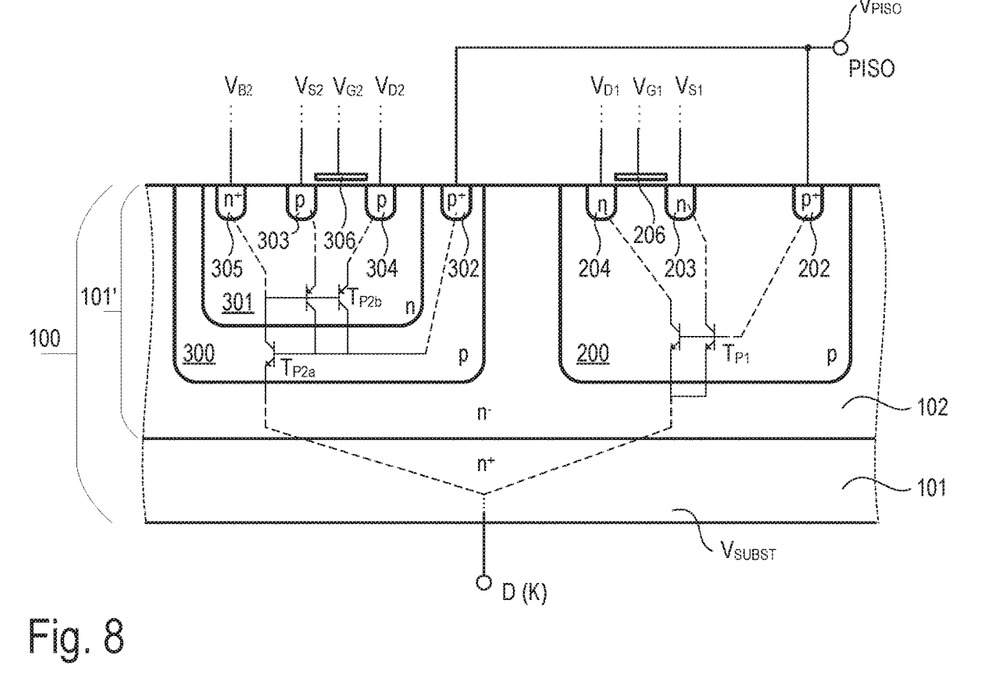
FIG. 8 is a cross-sectional view of a semiconductor body similar to FIG. 3; parasitic components which may give rise to latch-up effects are illustrated in this Figure.

FIG. 8 is a simplified cross-sectional view of a rectifier device as described herein with reference to FIGS. 1 to 7. An example of the portion of the rectifier device, which includes the power MOS transistor $M_P$, has been described with reference to in FIG. 3. As mentioned, other circuitry is integrated in the same semiconductor substrate such as the control circuit 11 (see FIG. 4) which may include the logic circuit 14 and the supply circuit 12. When—as in the example of FIG. 3—the power MOS transistor is an n-channel transistor, the semiconductor substrate 101 will be doped with dopants of the first type (n-type). Therefore, analogously to the example of FIG. 3, the semiconductor body 100 shown in FIG. 8 is essentially formed by the semiconductor substrate 101 (wafer), on which the (e.g. monocrystalline) semiconductor layer 101' is deposited using epitaxial growth. The semiconductor layer 101' is doped with dopants of the same type as the type of the dopants used for doping the substrate 101, wherein the concentration of dopants may be much lower in the semiconductor layer 101' (therefore labelled n$^-$) as compared to the highly doped substrate 101 (labelled n$^+$).

Well regions 200 and 300 may be formed in the semiconductor layer 101', e.g., using ion implantation, diffusion of dopants or other known doping processes. During fabrication, the well regions 200 and 300 may be formed in the same or in a different step as the body regions 103 shown in FIG. 3, and the type of dopants used to dope the well regions 200 and 300 is complementary to the type of dopants used to dope the semiconductor layer 101'. That is, well regions 200 and 300 are p-doped (thus referred to as p-wells) in case the substrate 101 and the semiconductor layer 101' are n-doped (thus referred to as n-substrate). Similar to the body regions 103, the p-wells 200 and 300 extend, from the top surface of the semiconductor body 100, vertically into the semiconductor layer 101' and are laterally confined by the material of the surrounding semiconductor layer 101'. Various circuit components may be integrated in the p-wells 200 and 300 and further p-wells. In the present example of FIG. 8, well region 200 includes an n-channel MOSFET and well region 300 includes a p-channel MOSFET. These two MOSFETs may be combined to form, e.g., a CMOS inverter or other circuitry. It is, however, emphasized that these two MOSFETs have to be merely regarded as representatives for arbitrary circuits and circuit elements (e.g. control circuit 11, see FIG. 4) integrated in the well regions 200 and 300 and other well regions in the semiconductor body 100. The individual integrated circuit components may be connected to form a specific circuit by conductive lines formed in one or more wiring layers on top of the semiconductor body 100. The wiring of integrated circuit components is as such known and thus not further explained herein.

To from an n-channel MOSFET in p-well 200, a drain region 203 and a source region 204 are formed within the p-well 200 and embedded therein. Drain region 203 and source region 204 are both doped with n-type dopants. A gate electrode 206 is arranged on the top surface of the semiconductor body 100, but electrically isolated therefrom. The gate electrode 206 extends between the drain region 203 and the source region 304. The p-well 200 can be regarded as the transistor body region and—when the gate electrode 206 is sufficiently charged during operation—an (n-type) MOS channel is generated in that portion of the p-well 200, which separates drain region 203 and source region 204 from each other. A well contact region 202 may also be formed within the p-well 200 and allows to contact the p-well 200. Usually, the well contact region 202 is p-doped but with a higher concentration of dopants than the p-well 200.

To from a p-channel MOSFET in p-well 300 an additional n-doped well 301 (n-well) is embedded in p-well 300. The n-well 301 may also be formed using ion implantation, diffusion of dopants or other known doping processes. It extends from the top surface of the semiconductor body vertically into the p-well 300 and thus is embedded within the p-doped semiconductor material of the p-well 300. Analogously to the n-channel MOSFET in p-well 200, a drain region 303 and a source region 304 are formed within the n-well 301. A gate electrode 306 is arranged on the top surface of the semiconductor body 100, but electrically isolated therefrom. The gate electrode 306 extends between the drain region 303 and the source region 304. The n-well 301 can be regarded as transistor body region, and—when the gate electrode 306 is sufficiently charged during operation—an (p-type) MOS channel is generated in that portion of the n-well 301, which separates drain region 303 and source region 304 from each other. A body contact region 305 is formed in the n-well 301 to allow to electrically contact the n-well 301. The body contact region is usually n-doped like the n-well but with a higher concentration of dopants that the n-well 301. Further, a well contact region 302 may also be formed within the p-well 300 and allows to contact the p-well 300. Usually, the well contact region 302 is p-doped but with a higher concentration of dopants than the p-well 300 (like well contact region 202).

As shown in FIG. 8, the voltage (potential) of the p-wells 200 and 300 is denoted as $V_{PISO}$. Drain, source, and gate voltage of the n-channel MOSFET in p-well 200 are denoted as $V_{D1}$, $V_{S1}$, and $V_{G1}$, respectively. The body voltage of the n-channel MOSFET equals $V_{PISO}$. Drain, source, gate, and body voltage of the p-channel MOSFET in n-well 301 are denoted as $V_{D2}$, $V_{S2}$, $V_{G2}$, and $V_{B2}$, respectively. One can see from FIG. 17, that a pn-junction is formed at the interface between the n-doped semiconductor layer 101' and the p-wells 200, 300. It is desired that—during normal operation—this pn-junction is reversed biased and thus forms a so-called pn-junction isolation. In applications with DC supply, the n-substrate 101 is usually electrically connected with the highest available DC supply voltage (i.e. substrate voltage $V_{SUBST}$ corresponds to the highest available supply voltage) and, as a result, the mentioned pn-junction isolation is always reverse biased and thus in a blocking state. However, the examples described herein relate to rectifier devices, which are operated with an alternating supply (input) voltage that is applied between drain and source of the power MOS transistor $M_P$ integrated in the rectifier device (see, e.g., FIGS. 3 and 4). As the drain of the power MOS transistor $M_P$ is electrically connected to the n-substrate (see FIG. 3, drain electrode 116, substrate 101), the substrate voltage $V_{SUBST}$ is not a DC voltage but an alternating voltage as shown, for example, in FIG. 7A.

As can be seen in FIG. 7A, the substrate voltage $V_{SUBST}$ cyclically assumes negative values (if the reference potential $V_{REF}$ is defined as 0V), and thus the above-mentioned pn-junction isolation may be come forward biased which may cause a latch-up of the rectifier device. A latch-up may be caused by an undesired activation of parasitic transistors shown in FIG. 8 and explained in the following. The pn-junction between p-well 200 and the subjacent n-doped semiconductor layer 101' may form the base-emitter diode of a parasitic npn-type bipolar junction transistor $T_{P1}$. The pn-junctions between the p-well 200 and the n-doped drain and source regions 203, 204 form multiple collector-base diodes of the parasitic transistor $T_{P1}$. One can see from FIG. 8 that parasitic transistor $T_{P1}$ may be switched on, when the substrate voltage $V_{SUBST}$ becomes negative and thus the base-emitter diode of transistor TP1 becomes forward biased. An activated (switched on) parasitic transistor $T_{P1}$ may de-facto short-circuit the substrate 101 with drain and source regions 203, 204, which may irreversibly damage the rectifier device.

Similar to parasitic transistor $T_{P1}$, the pn-junction between p-well 300 and the subjacent n-doped semiconductor layer 101' may form the base-emitter diode of a further parasitic npn-type bipolar junction transistor $T_{P2a}$. The pn-junction between the p-well 300 and the n-well 301 form the collector-base diode of the parasitic transistor $T_{P2a}$. Simultaneously, the pn-junction between the p-well 300 and the n-well 301 form the collector-base diode of a parasitic pnp-type bipolar junction transistor $T_{P2b}$, whose multiple emitters are formed by the drain and source regions 303 and 304 embedded in n-well 301. The two parasitic transistors $T_{P2a}$ and $T_{P2b}$ are connected in a way that they form a thyristor (pnpn-structure) with the p-well 300 forming the thyristor's gate. This thyristor may be switched on, when the substrate voltage $V_{SUBST}$ becomes negative and thus the base-emitter diode of transistor $T_{P2a}$ becomes forward biased (which in turn leads to an activation of transistor $T_{P2b}$). The activated (switched on) thyristor may de-facto short-circuit the substrate 101 with drain and source regions 303, 204, which also may irreversibly damage the rectifier device.

To prevent short circuits, latch-up and similar effects in the rectifier device due to the activation of parasitic bipolar junction transistors or thyristors the pn-junction isolations between the substrate 101 and the p-wells 200 and 300 (and further p-wells) have to be maintained in an isolating state during any operation state of the rectifier device, even during operation states, in which the substrate voltage $V_{SUBST}$ is negative. In other words, the pn-junctions between the n-doped semiconductor layer 101' and the p-wells 200 and 300 have to be (and maintained) reverse biased irrespective of the polarity of the substrate voltage $V_{SUBST}$.

One solution of the above-described problem with regard to latch-up and similar effects is to employ a circuit including one or more switches configured to electrically connect the p-wells (e.g. p-wells 200 and 300) to the substrate 101 during operating states, in which the substrate voltage is negative with respect to ground potential, which is the potential of the anode terminal of the rectifier device 10 (i.e. the source electrode of the MOS transistor $M_P$, see FIG. 4). In this regard "to electrically connect" means to connect by a comparably low-resistance current path, which may be provided, e.g. by an active MOS channel of a MOS transistor.

Figure 9:
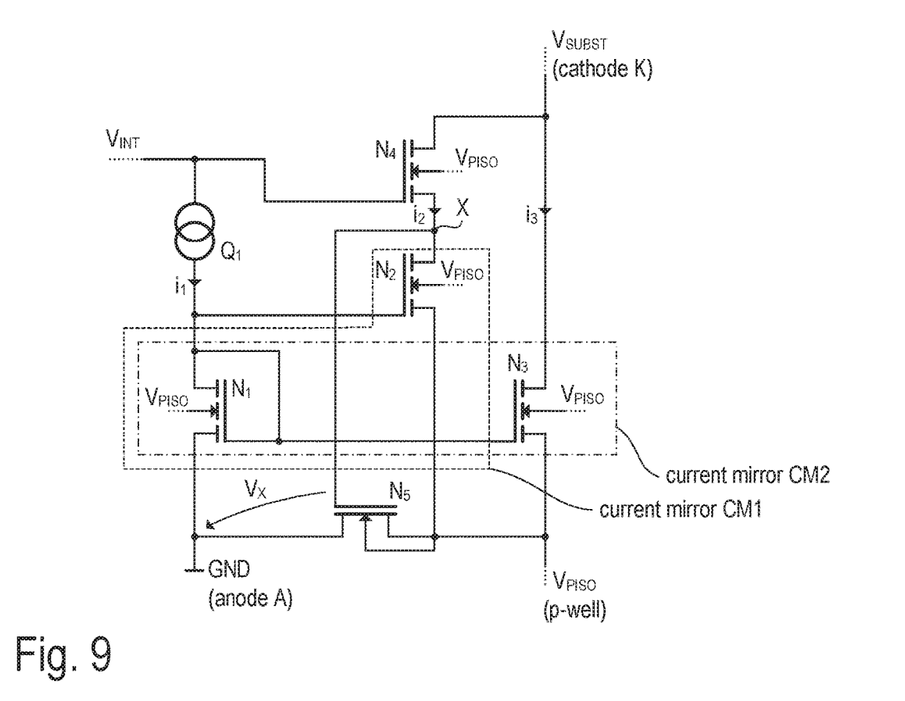
FIG. 9 is one exemplary circuit which may used to prevent activation of parasitic components.

FIG. 9 illustrates a circuit which allows to switch one or more p-wells (voltage $V_{PISO}$) between ground GND (anode A of the rectifier device) and substrate (see FIG. 8, regions 101, 102, cathode K of rectifier device) with low quiescent current and low complexity of the circuit. According to FIG. 9 the circuit includes basically two current mirrors CM1 and CM2 as well as one semiconductor switch $N_5$ which is configured to connect one or more of the p-wells to ground GND (and thus to the anode A). The first current mirror CM1 includes an input stage with a first transistor $N_1$ and an output stage with a second transistor $N_2$. The first transistor $N_1$ of the input stage may be implemented as an n-channel MOSFET and is connected as a diode (gate electrically connected to drain). The diode-connected transistor $N_1$ is connected in series with a current source circuit $Q_1$, wherein the series circuit is coupled between ground GND and a supply node, at which an internal supply voltage $V_{INT}$ is provided. The internal supply voltage $V_{INT}$ may directly or indirectly depend on the output voltage $V_S$ generated, for example, by the supply circuit 12 shown in FIG. 6 or any other suitable supply circuit. That is, the internal supply voltage $V_{INT}$ may be equal to the voltage $V_S$ provided by the supply circuit 12 or derived therefrom. For example, the internal supply voltage $V_{INT}$ may be a few volts, e.g. approximately 2-5V. In the present embodiment, the current source circuit $Q_1$ is be a constant current source; in other embodiments the current source circuit $Q_1$ is a simple resistor or any other circuitry suitable to limit the drain current $i_1$ of transistor $N_1$.

The transistor $N_2$ of the output stage of current mirror CM1 has a gate electrode electrically connected to the gate electrode of transistor $N_1$. The source of transistor $N_2$ is electrically connected to the p-well. The drain of transistor $N_2$ is connected to substrate (and thus to the cathode K of the rectifier device) via a pull-up circuit that, in the present example, is composed of a further transistor $N_4$, which—together with transistor $N_2$—forms a kind of cascode circuit. That is, the drain-source current paths of transistors $N_2$ and $N_4$ are connected in series and the gate electrode of transistor $N_4$ is connected to the supply circuit node that provides the internal supply voltage $V_{INT}$. Accordingly, when the substrate voltage is positive and at a sufficiently high level (to drive the mirror current $i_2$), then the mirror current $i_2$ (drain current of transistor $N_2$) passing through transistors $N_2$ and $N_4$ corresponds to the drain current $i_1$ of transistor $N_1$, and the voltage $V_X$ at circuit node X between transistors $N_2$ and $N_4$ equals $V_{INT}-V_{GS4}$, wherein $V_{GS4}$ is the gate-source voltage of transistor $N_4$. In this situation the voltage $V_X$ is high enough to activate the further transistor $N_5$, whose drain-source current path connects the p-well with ground and whose gate is provided with the voltage $V_X$. Summarizing the above, for sufficiently positive substrate voltages $V_{SUBST}$, the voltage $V_X$ at circuit node X is high enough to switch on the transistor $N_5$ and thus to electrically connect the p-well to ground ($V_{PISO}=0V$).

The second current mirror is formed by transistor $N_1$, which is the input stage for both current mirrors, CM1 and CM2, and transistor $N_3$, whose drain-source current path is connected between substrate (cathode terminal K) and p-well and whose gate is connected to the gates of transistors $N_1$ and $N_2$ as shown in FIG. 9. For sufficiently positive substrate voltages $V_{SUBST}$, the transistor $N_3$ will sink a drain current $i_3$ from substrate. The current mirror CM2 may, however, be designed such that the current $i_3$ is comparably small and does not contribute significantly to the overall power losses.

When the substrate voltage $V_{SUBST}$ decreases and becomes negative (in each cycle, see FIG. 7A), then the output stages (transistors $N_2$ and $N_3$) cannot anymore mirror the current $i_1$. That is, they cannot sink the drain currents $i_2$ and $i_3$ in a way that they are proportional to drain current $i_1$. When the substrate voltage $V_{SUBST}$ becomes negative, then transistor $N_4$ is operated in a reverse direction (drain becomes source and source becomes drain) in its linear region (triode or ohmic mode). In this situation, the resistance of the MOS channel of transistor $N_4$ is low enough to pull the voltage $V_X$ at circuit node X towards negative values (i.e. transistor $N_4$ acts as a pull-down resistor) to switch the transistor $N_5$ off thus disconnecting the p-well from ground GND.

When the substrate voltage $V_{SUBST}$ becomes negative, then transistor $N_3$ is also operated in a reverse direction (drain becomes source and source becomes drain) in its linear region (triode or ohmic mode). In this situation, the resistance of the MOS channel of transistor $N_3$ is low enough to pull the voltage $V_{PISO}$ in the p-well towards the negative substrate voltage $V_{SUBST}$. When the substrate voltage $V_{SUBST}$ again rises in the next cycle, the transistors $N_1$, $N_2$, and $N_3$ will again operate as current mirrors CM1, CM2 and transistor N5 will be re-activated to connect the p-well to ground GND. The input stage transistor $N_1$ of current mirror CM1 in combination with the current source circuit $Q_1$ can be regarded as a (biasing) circuit configured to provide a gate voltage to transistor $N_3$, so that the third transistor $N_3$ operates in its linear region. When the substrate voltage $V_{SUBST}$ is negative, the resistance of the drain-source path of transistor $N_3$ will be lower as compared with a situation, in which the substrate voltage $V_{SUBST}$ is at a high (positive) value. As such, transistor $N_3$ acts as a pull-down resistor when the substrate voltage $V_{SUBST}$ is negative.

Figure 10:
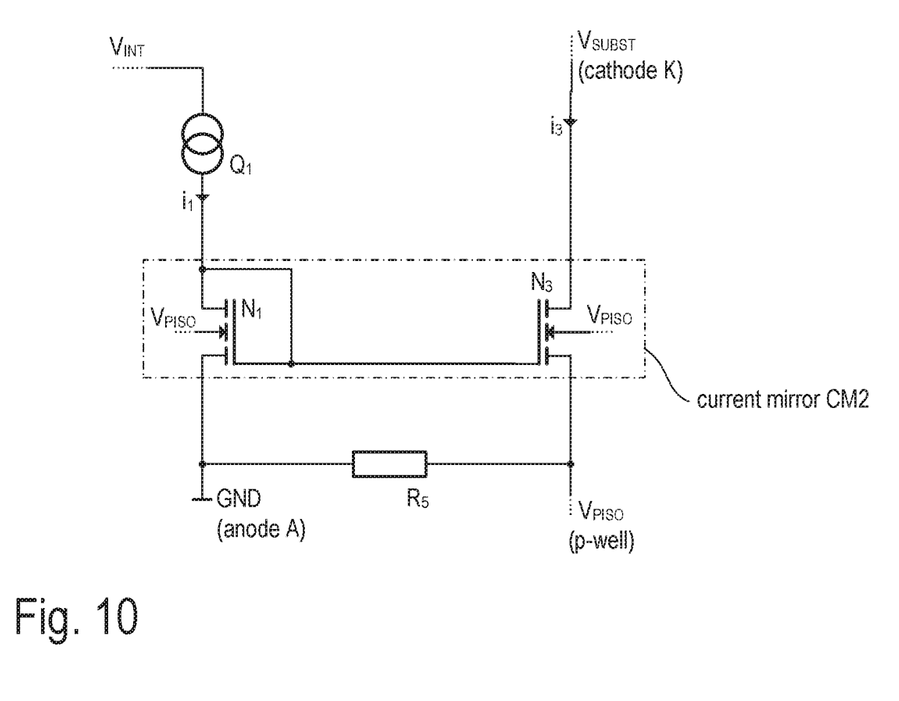
FIG. 10 is another exemplary circuit, which is a simplified modification of the example of FIG. 9.

All transistors $N_1$ to $N_5$ may be implemented as n-channel MOSFETs of the enhancement-type. However, in the present example, the transistor $N_5$ is of the depletion type (threshold voltage for activating the transistor is negative). FIG. 10 illustrates a modification of the circuit of FIG. 9, in which transistor $N_5$, which can be seen as a controllable (adjustable) resistance, is replaced by an ohmic resistor $R_5$. As a consequence, transistors $N_2$ and $N_4$, which basically drive the transistor $N_5$ in a high ohmic state (when substrate voltage is low) or a low ohmic state (when substrate voltage is high), may be omitted. The current mirror CM2 is identical with the previous example of FIG. 9, whose output transistor N3, provides a low ohmic connection to substrate (cathode terminal K) when the substrate voltage is low (i.e. at negative voltages). In this situation, the resistance provided by transistor N3 is lower than the resistor $R_5$ and thus the voltage $V_{PISO}$ is pulled towards the substrate voltage $V_{SUBST}$ instead of ground potential.

Although various embodiments have been illustrated and described with respect to one or more specific implementations, alterations and/or modifications may be made to the illustrated examples without departing from the spirit and scope of the features and structures recited herein. With particular regard to the various functions performed by the above described components or structures (units, assemblies, devices, circuits, systems, etc.), the terms (including a reference to a "means") used to describe such components are intended to correspond—unless otherwise indicated—to any component or structure that performs the specified function of the described component (e.g., that is functionally equivalent), even if it is not structurally equivalent to the disclosed structure that performs the function in the herein illustrated exemplary implementations of the present disclosure.

The invention claimed is:

1. A rectifier device comprising:
   a semiconductor body doped with dopants of a first doping type;
   one or more well regions arranged in the semiconductor body and doped with dopants of a second doping type, the one or more well regions and the surrounding semiconductor body forming a pn-junction;
   an anode terminal and a cathode terminal connected by a load current path of a first MOS transistor and a diode connected parallel to the load current path, wherein an alternating input voltage is operably applied between the anode terminal and the cathode terminal;
   a control circuit that is configured to switch on the first MOS transistor for an on-time period, during which the diode is forward biased, the first MOS transistor and the diode being integrated in the semiconductor body and the control circuit being at least partly arranged in the one or more well regions; and
   a switching circuit that is configured to electrically connect a first well region of the one or more well regions with the anode terminal, as long as the alternating input voltage is above a predetermined threshold value, and, to pull the voltage of first well region towards the alternating input voltage, as long as the alternating input voltage is at or below the predetermined threshold value.

2. The rectifier device of claim 1, wherein to electrically connect the first well region with the anode terminal the switching circuit comprises:
   a resistor coupled between the first well region and the anode terminal.

3. The rectifier device of claim 1, wherein to electrically connect the first well region with the anode terminal the switching circuit comprises:
   a first transistor coupled between the first well region and the anode terminal.

4. The rectifier device of claim 3,
   wherein the first transistor is configured to selectively connect the first well region and the anode terminal,
   wherein the first transistor has a gate connected to a circuit node, which is coupled to the cathode terminal, the voltage of the circuit node alternating in accordance with the alternating input voltage.

5. The rectifier device of claim 4, wherein the switching circuit further comprises:
   a second transistor coupled between the cathode terminal and the circuit node, a gate of the second transistor being coupled to a supply node to receive an internal supply voltage.

6. The rectifier device of claim 5, wherein the switching circuit further comprises:
   a third transistor coupled between the cathode terminal and the first well region;
   a circuit configured to provide a gate voltage to the third transistor, so that the third transistor operates in its linear region.

7. The rectifier device of claim 6, wherein the circuit configured to provide the gate voltage to the third transistor comprises:
   a fourth transistor coupled to the anode terminal and configured to receive a drain current from a current source circuit, a gate electrode of the fourth transistor being connected to a gate electrode of the third transistor and connected to a drain of the fourth transistor.

8. The rectifier device of claim 1, wherein the switching circuit further comprises:
   a second transistor and a fifth transistor that form a cascode circuit coupled between the well region and the cathode terminal;
   a gate electrode of the second transistor being connected to a circuit node operably receiving a substantially constant gate voltage.

9. The rectifier device of claim 8, wherein the switching circuit further comprises:
   a first transistor configured to connect and disconnect the first well region and the anode terminal,
   wherein the transistor has a gate connected to a common circuit node of the second transistor and a fifth transistor.

10. The rectifier device of claim 9, wherein the switching circuit further comprises:
    a fourth transistor coupled to the anode terminal and configured to receive a drain current from a current source circuit, a gate electrode of the fourth transistor being connected to gate electrodes of the third transistor and the fifth transistor and connected to a drain of the fourth transistor.

11. A semiconductor device comprising:
    a semiconductor body doped with dopants of a first doping type;
    one or more well regions arranged in the semiconductor body and doped with dopants of a second doping type;
    an alternating substrate voltage being operably applied to the semiconductor body;
    a switching circuit that includes:
    a first transistor coupled between the first well region and the anode terminal,
    a third transistor coupled between the first well region and the cathode terminal,
    a second transistor coupled between the cathode terminal and a first circuit node,
    a fifth transistor coupled between the first circuit node and the first well region, and
    a series circuit with a fourth transistor and a current source circuit coupled between an internal supply node and the anode terminal,
    wherein the third transistor, the fourth transistor, and the fifth transistor have gate electrodes coupled to a drain of the fourth transistor,
    wherein the first transistor has a gate electrode coupled to the first circuit node and
    wherein the second transistor has a gate electrode coupled to the internal supply node.

12. The circuit of claim 11,
    wherein the first transistor, the second transistor, the third transistor, the fourth transistor, and the fifth transistor are n-channel MOS transistors.

13. The circuit of claim 11,
    wherein the first transistor is a depletion-type MOS transistor.

* * * * *